US008110486B2

United States Patent
Matsumoto et al.

(10) Patent No.: US 8,110,486 B2
(45) Date of Patent: Feb. 7, 2012

(54) METHOD OF MANUFACTURING SEMICONDUCTOR WAFER BY FORMING A STRAIN RELAXATION SIGE LAYER ON AN INSULATING LAYER OF SOI WAFER

(75) Inventors: Koji Matsumoto, Tokyo (JP); Tomoyuki Hora, Tokyo (JP); Akihiko Endo, Tokyo (JP); Etsurou Morita, Tokyo (JP); Masaharu Ninomiya, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

(21) Appl. No.: 11/649,943

(22) Filed: Jan. 5, 2007

(65) Prior Publication Data

US 2007/0166929 A1    Jul. 19, 2007

(30) Foreign Application Priority Data

Jan. 18, 2006   (JP) ................................ 2006-009881

(51) Int. Cl.
*H01L 21/20* (2006.01)
(52) U.S. Cl. ........ 438/509; 438/479; 438/492; 438/493; 257/E21.1; 257/E21.561
(58) Field of Classification Search ................. 438/479, 438/494, 509, 492, 493; 257/E21.703, E21.561, 257/E21.092, E21.1, E21.102, E21.104
See application file for complete search history.

(56) References Cited

U.S. PATENT DOCUMENTS

| 6,569,715 B1* | 5/2003 | Forbes ......................... 438/138 |
| 6,690,043 B1* | 2/2004 | Usuda et al. .................. 257/194 |
| 7,022,593 B2* | 4/2006 | Arena et al. .................. 438/494 |
| 7,060,632 B2* | 6/2006 | Fitzgerald et al. ............ 438/767 |
| 2005/0054175 A1* | 3/2005 | Bauer .......................... 438/404 |
| 2005/0221591 A1* | 10/2005 | Bedell et al. .................. 438/479 |

FOREIGN PATENT DOCUMENTS

| JP | 7169926 A | 7/1995 |
| JP | 9321307 A | 12/1997 |
| JP | 2000243946 A | 9/2000 |
| JP | 200331495 A | 1/2003 |

OTHER PUBLICATIONS

McVay et al., Diffusion of Ge in SiGe alloys, Physycal Review B, vol. 9, No. 2, Jan. 15, 1974, pp. 627-629.*

* cited by examiner

*Primary Examiner* — Julio J Maldonado
(74) *Attorney, Agent, or Firm* — Sughrue Mion, PLLC

(57) ABSTRACT

A semiconductor wafer is produced at a step of forming a lattice relaxation or a partly lattice-relaxed strain relaxation SiGe layer on an insulating layer in a SOI wafer comprising an insulating layer and a SOI layer, wherein at least an upper layer side portion of the SiGe layer is formed on the SOI layer at a gradient of Ge concentration gradually decreasing toward the surface and then subjected to a heat treatment in an oxidizing atmosphere.

3 Claims, 4 Drawing Sheets

METHOD OF MANUFACTURING SEMICONDUCTOR WAFER BY FORMING A STRAIN RELAXATION SIGE LAYER ON AN INSULATING LAYER OF SOI WAFER

BACKGROUND OF THE INVENTION

1. Field of the Invention

This invention relates to a method of producing a semiconductor wafer in which a lattice relaxation or a partly lattice-relaxed strain relaxation SiGe layer having a less defect and containing a uniform and high concentration of Ge can be formed on an insulating layer inside SOI wafer.

2. Description of the Related Art

In a silicon MOS device, the speeding-up and the low power consumption are established by conducting the scale down according to a scaling rule or the reduction of an operating voltage. However, in case of a region having a gate length of not more than 100 nm, the above establishment becomes difficult. For this end, an SOI substrate and an introduction of strained silicon are examined. Particularly, a substrate formed by introducing the strained silicon into the SOI substrate is considered as an ultimate substrate and studies thereof are going forward.

In order to put such a substrate into practical use, it is required to control a distance from a buried oxide film to a strained silicon layer as a channel layer as far as possible for the development of an effect of SOI substrate structure suppressing an influence of stray capacitance. For this end, it is most desirable to directly deposit a strained Si layer just able the buried oxide film of the SOI structure, but it is common to use a strain-relaxed SiGe layer as an intermediate layer under present circumstances. That is, in order to completely develop the superiority of the strained silicon SOI substrate, it is necessary that the aforementioned distance from the buried oxide film to the strained silicon layer as a channel layer is controlled as far as possible but also the SiGe layer as an intermediate layer is strain-relaxed.

As the first method of forming the strain-relaxed SiGe layer is mentioned a method based on a combination of SOI substrate and SiGe epitaxial technology. For example, JP-A-H07-169926 discloses a method wherein a SiGe layer is formed on the existing SOI substrate to cause strain relaxation and a Si layer is formed on the strain-relaxed SiGe layer to provide a strained Si. In this method, however, the SiGe layer of not less than few μm is interposed between the buried oxide film and the active layer as the channel layer for reducing defects, so that the superiority of the SOI substrate structure can not be developed sufficiently.

As the second method of forming the strain-relaxed SiGe layer, for example, JP-A-2000-243946 discloses a method wherein a silicon single crystal substrate is used instead of the expensive SOI substrate and an oxygen-containing silicon layer, SiGe layer and Si layer are formed on the silicon single crystal substrate as a single crystal layer inheriting lattice information of the substrate and then subjected to a thermal oxidation treatment. In this method, however, the strain in the SiGe layer can not be relaxed sufficiently and also the sufficient strain is not added to the strained Si in the active layer, so that the superiority of the strained Si can not be developed.

As the third method of forming the strain-relaxed SiGe layer, for example, JP-A-2003-31495 discloses a method wherein the SiGe layer id formed on the SOI substrate and partly melted by heating to diffuse Ge into the SOI layer and then the SiGe layer is solidified to conduct strain relaxation. In the substrate prepared by this method, however, the defect density becomes higher.

As the fourth method of forming the strain-relaxed SiGe layer, for example, JP-A-H09-321307 discloses a method wherein the SiGe layer is formed on a silicon substrate and thereafter an oxygen ion is injected into the SiGe layer by an oxygen ion injection-separation method (SIMOX) to form a buried insulating layer in the SiGe layer and then a strained silicon layer is formed. In this method, however, the buried insulating layer is formed in the SiGe layer, so that there is a problem that the pressure resistance of the buried insulating layer is easily deteriorated due to the residual Ge, which badly affects the characteristics of the semiconductor element.

SUMMARY OF THE INVENTION

It is, therefore, an object of the invention to provide a method of producing a semiconductor wafer in which a lattice relaxation or a partly lattice-relaxed strain relaxation SiGe layer having a less defect and containing a uniform and high Ge concentration can be formed on an insulating layer in a SOI wafer by rationalizing the Ge concentration in the SiGe layer prior to heat treatment.

In order to achieve the above object, the invention lies in (1) a method of producing a semiconductor wafer comprising a step of forming a lattice relaxation or a partly lattice-relaxed strain relaxation SiGe layer on an insulating layer in a SOI wafer comprising an insulating layer and a SOI layer, wherein at least an upper layer side portion of the SiGe layer is formed on the SOI layer at a gradient of Ge concentration gradually decreasing toward the surface and then subjected to a heat treatment in an oxidizing atmosphere at the step of forming the strain-relaxed SiGe layer.

(2) A method of producing a semiconductor wafer according to the item (1), wherein the heat treatment is carried out at a temperature of not lower than 1100° C.

(3) A method of producing a semiconductor wafer according to the item (1) or (2), wherein a whole of the SiGe layer before the heat treatment is formed on the SOI layer at the gradient of Ge concentration gradually decreasing toward the surface thereof.

(4) A method of producing a semiconductor wafer according to the item (1) or (2), wherein a portion of the SiGe layer facing the wafer before the heat treatment is formed on the SOI layer at a constant Ge concentration and then the upper layer side portion of the SiGe layer is formed at the gradient of Ge concentration gradually decreasing toward the surface thereof.

(5) A method of producing a semiconductor wafer according to the item (1) or (2), wherein a portion of the SiGe layer facing the wafer before the heat treatment is formed on the SOI layer at a gradient of Ge concentration gradually increasing toward the surface thereof and then the upper layer side portion of the SiGe layer is formed at the gradient of Ge concentration gradually decreasing toward the surface thereof.

(6) A method of producing a semiconductor wafer according to the item (1) or (2), wherein the SiGe layer before the heat treatment is formed as a laminate by laminating a plurality of one or more SiGe layers before the heat treatment selected from the SiGe layers before the heat treatment defined in the items (3)-(5).

(7) A method of producing a semiconductor wafer according to any one of the items (1)-(6), wherein a Si layer is further formed on the SiGe layer before the heat treatment prior to the heat treatment.

(8) A method of producing a semiconductor wafer according to any one of the items (1)-(7), wherein the SiGe layer before the heat treatment has a maximum value of Ge concentration of not more than 30 mass %.

(9) A method of producing a semiconductor wafer according to any one of the items (1)-(8), wherein the SiGe layer before the heat treatment has a gradient of Ge concentration of not more than 2 mass %/nm.

According to the invention, there can be provided a method of producing a semiconductor wafer in which a lattice relaxation or a partly lattice-relaxed strain relaxation SiGe layer having a less defect and containing a uniform and high Ge concentration can be formed on an insulating layer in a SOI wafer by rationalizing the Ge concentration in the SiGe layer prior to heat treatment.

BRIEF DESCRIPTION OF THE DRAWINGS

The invention will be described with reference to the accompanying drawings, wherein.

DESCRIPTION OF THE PREFERRED EMBODIMENTS

Figure 1:
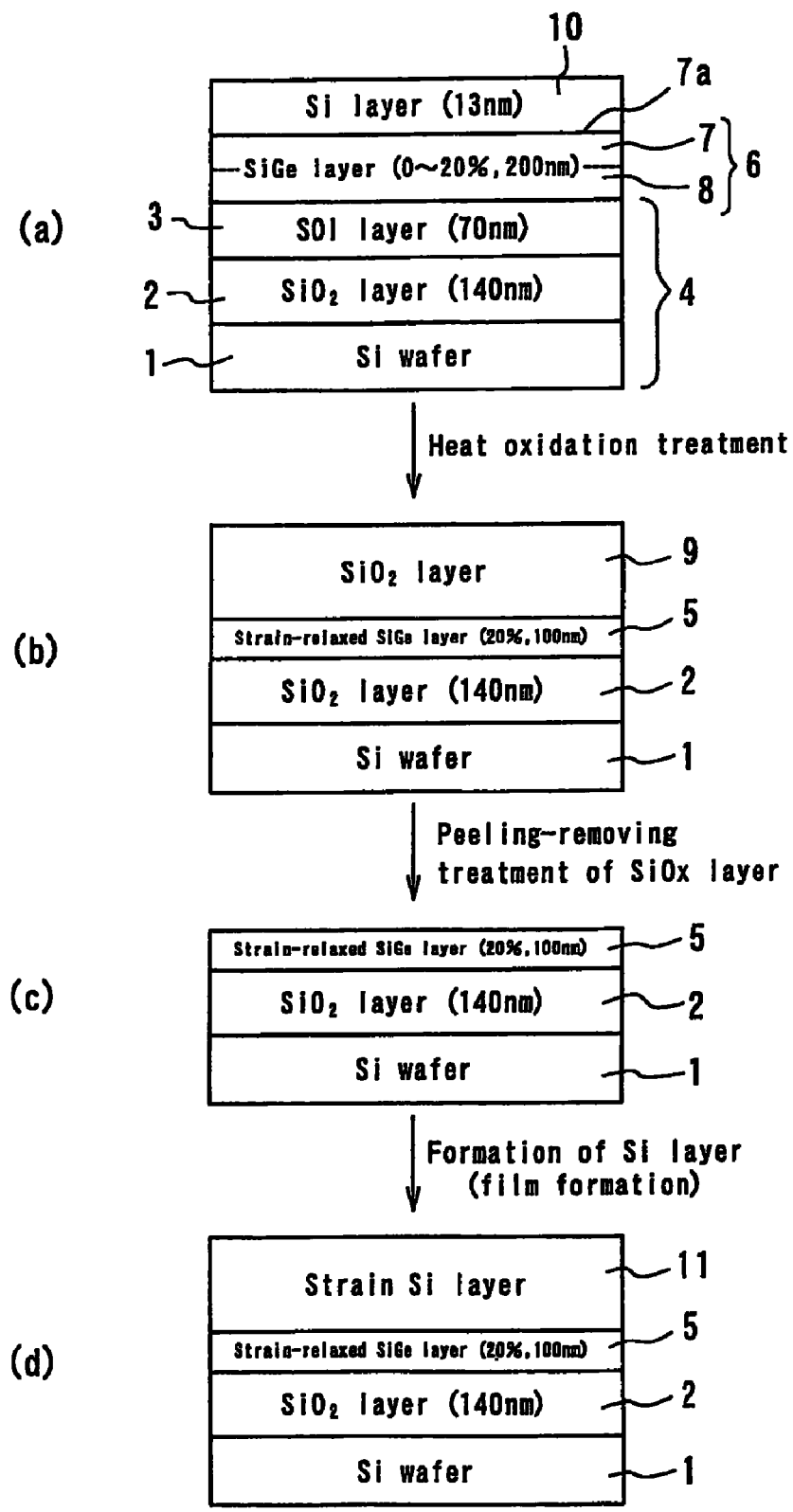
FIG. 1 is a flow chart illustrating steps of producing a semiconductor wafer by a production method according to the invention.

In FIG. 1 is shown a flow chart illustrating production steps of a semiconductor wafer by the production method of the invention.

Figure 2:
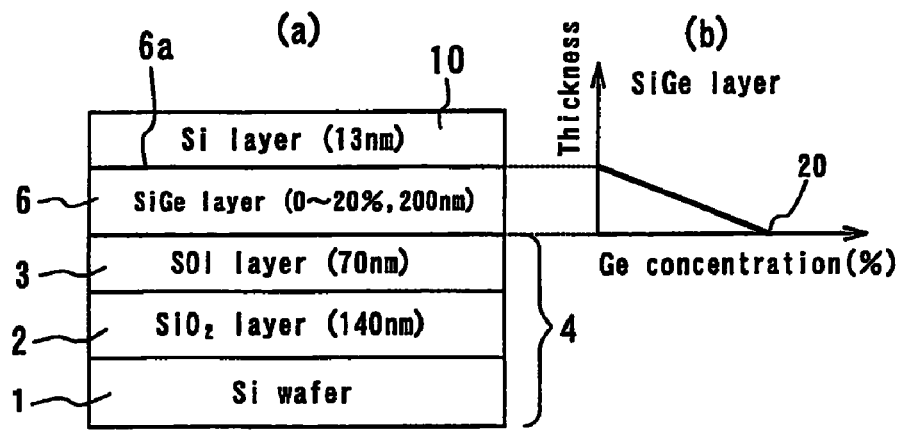
FIG. 2 is a view of an embodiment of SiGe layer before heat treatment (Example 1) in which (a) is a section view of the SiGe layer before heat treatment and (b) shows a Ge concentration corresponding to a thickness of the SiGe layer of (a)
Figure 3:
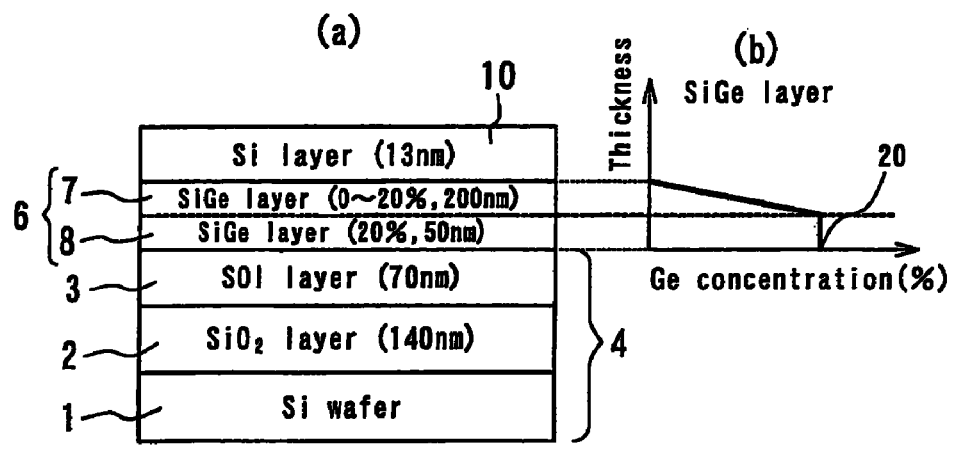
FIG. 3 is a view of another embodiment of SiGe layer before heat treatment (Example 2) in which (a) is a section view of the SiGe layer before heat treatment and (b) shows a Ge concentration corresponding to a thickness of the SiGe layer of (a)
Figure 4:
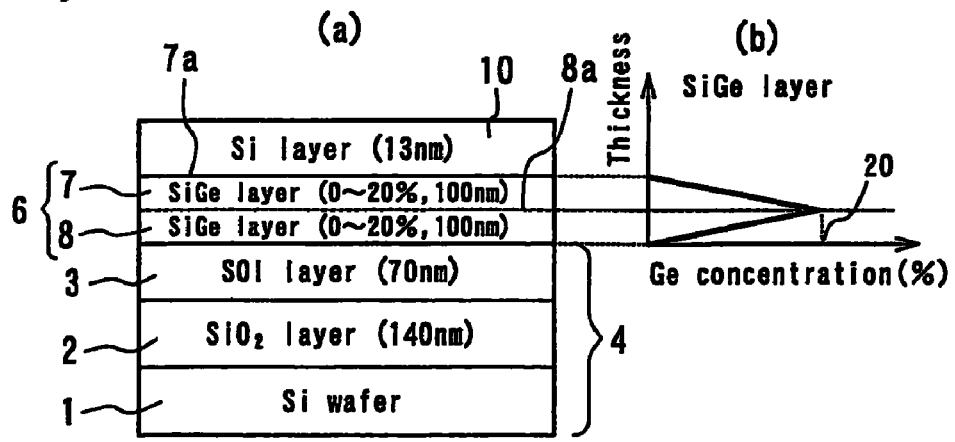
FIG. 4 is a view of the other embodiment of SiGe layer before heat treatment (Example 3) in which (a) is a section view of the SiGe layer before heat treatment and (b) shows a Ge concentration corresponding to a thickness of the SiGe layer of (a)
Figure 5:
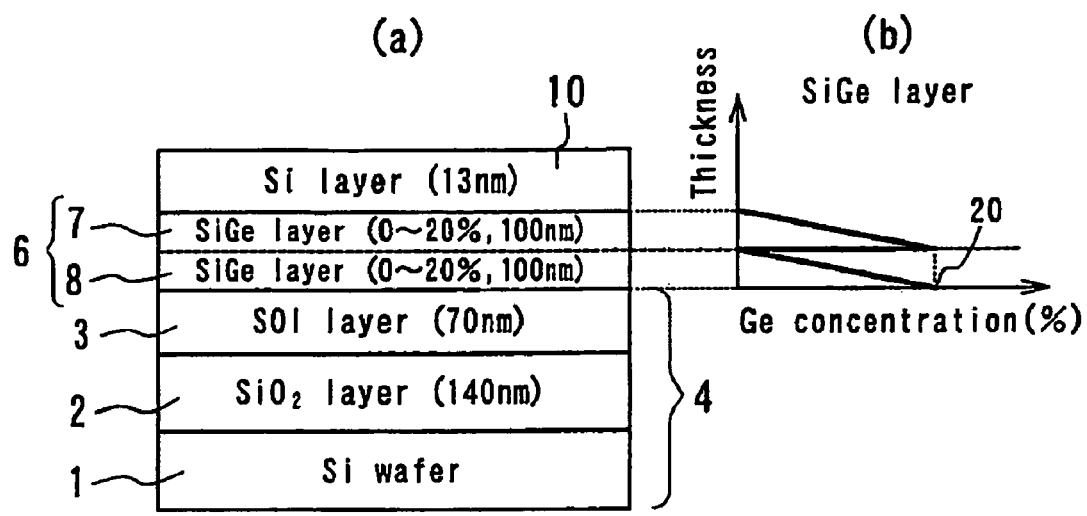
FIG. 5 is a view of a still further embodiment of SiGe layer before heat treatment (Example 4) in which (a) is a section view of the SiGe layer before heat treatment and (b) shows a Ge concentration corresponding to a thickness of the SiGe layer of (a)

The invention is a method of producing a semiconductor wafer comprising a step of forming the lattice relaxation or a partly lattice-relaxed strain relaxation SiGe layer 5 on an insulating layer ($SiO_2$ layer) 2 in a SOI wafer 4 constructed with a Si wafer 1, an insulating layer ($SiO_2$ layer) 2 and a SOI layer (Si active layer) 3. Concretely, a single crystal SiGe layer 6 is formed on the SOI wafer 4 at such a gradient of Ge concentration that the concentration in at least an upper layer side portion 7 gradually decreases toward a surface 7a thereof (see, for example, FIG. 1(a) and FIGS. 2(a) and (b)) and then subjected to a heat treatment in an oxidizing atmosphere (heat oxidation treatment), whereby Ge in the SiGe layer 6 having a gradient of Ge concentration in a thickness direction is diffused toward the SOI layer 3 and at the same time the single crystal SiGe layer 6 is oxidized from the surface 7a of the upper layer side portion 7 to change a part of the single crystal SiGe layer 6 into a $SiO_2$ layer and the diffused Ge is uniformly enriched in the SOI layer 3 and the remaining portion of the single crystal SiGe layer 6, and hence there can be formed a lattice relaxation or a partly lattice-relaxed strain relaxation SiGe layer 5 having a less defect and containing a uniform and high Ge concentration (FIG. 1(b)). Since Ge in the SiGe layer 6 does not diffuse into the $SiO_2$ layer inside the SOI wafer 4 and a $SiO_2$ layer formed from the surface through oxidation, the Ge concentration increases with the oxidation and finally it is possible to form the strain-relaxed SiGe layer 5 having a uniform Ge concentration.

Further, the Ge concentration in the SiGe layer 6 is made high at a side of the SOI wafer 4 (a side of the SOI layer 3 in a narrow sense), whereby the relaxation is easily caused at an interface between the insulating layer ($SiO_2$ layer) 2 and the SOI layer 3 and the SiGe layer 6 in the heat oxidation treatment. Also, since the insulating layer ($SiO_2$ layer) 2 is sufficiently flexible, the relaxation becomes easy without misfit dislocation.

In FIG. 1(a) is shown a case that a Si layer 10 is further formed on the SiGe layer 6 prior to the heat oxidation treatment. Such a Si layer 10 is arranged as a cap layer for preventing the evaporation of Ge in the SiGe layer 6 from the surface 7a to an exterior in the heat oxidation treatment. This layer may be arranged, if necessary.

The heat treatment is preferable to be carried out at a temperature of not lower than 1100° C. When the temperature of the heat treatment is lower than 1100° C., the $SiO_2$ layer becomes not sufficiently flexible and hence there is a tendency of more introducing defects in the occurrence of relaxation, and also the chance of introducing defects is easily caused because the diffusion of Ge does not occur smoothly, and the defects introduced hardly disappear. Moreover, as the heat treatment is frequently a case that the temperature is raised from a temperature of lower than 900° C. to not lower than 1100° C. and kept at the predetermined temperature. In this case, the oxidation gradually proceeds in the surface layer of the wafer even at such a temperature region that the diffusion of Ge below 900° C. is slower than the oxidation rate, so that the enriched Ge layer is easily formed at the interface. In the invention, however, the enriched Ge layer is hardly formed at the interface by providing the predetermined gradient of Ge concentration in the SiGe layer, whereby the occurrence of misfit dislocation can be suppressed.

The reason why the atmosphere of the heat treatment is limited to the oxidizing atmosphere is due to the fact that the enrichment of Ge through the oxidation is indispensable for obtaining a SiGe thin film having a high concentration. As the oxidizing atmosphere may be mentioned an oxygen atmosphere, a combination of oxygen with an inert gas such as nitrogen, argon or the like, and air.

In the production method of the semiconductor wafer according to the invention, the $SiO_2$ layer 9 formed by the heat oxidation treatment is peeled and removed with a hydrofluoric acid (HF) or the like as shown in FIG. 1(c) and then a strain Si layer is formed (film formation) as shown in FIG. 1(d), if necessary, whereby the semiconductor wafer can be produced.

FIGS. 2-5 show various embodiments of SiGe layer before the heat treatment according to the invention, in which (a) is a section view of SiGe layer before heat treatment and (b) shows a Ge concentration in correspondence with a thickness of the SiGe layer of (a).

In FIGS. 2(a) and (b) is shown an embodiment that a whole of the SiGe layer 6 before the heat treatment is formed on the SOI layer at a gradient of Ge concentration gradually decreasing toward a surface 6a.

In FIGS. 3(a) and (b) is shown an embodiment that a portion 8 of the SiGe layer 6 before the heat treatment facing the SOI layer is formed on the SOI layer at a constant Ge concentration and thereafter the upper layer side portion 7 of the SiGe layer 6 is formed thereon at a gradient of Ge concentration gradually decreasing toward the surface 7a.

In FIGS. 4(a) and (b) is shown an embodiment that a portion 8 of the SiGe layer 6 before the heat treatment facing the SOI layer is formed on the SOI layer 3 at a gradient of Ge concentration gradually increasing toward a surface 8a and thereafter the upper layer side portion 7 of the SiGe layer 6 is formed thereon at a gradient of Ge concentration gradually decreasing toward the surface 7a.

In FIGS. 5(a) and (b) is shown an embodiment that the SiGe layer before the heat treatment is a formed as a laminate obtained by laminating two SiGe layers 6 each having the gradient of Ge concentration shown in FIG. 2(b).

As a method of forming the SiGe layer 6 having such a gradient of Ge concentration are mentioned a method wherein a CVD (Chemical Vapor Deposition) apparatus is used to control a flow amount of a gas as a Ge source in a chamber of this apparatus provided with a SOI wafer therein, a method of controlling a gas as a Si source or a carrier gas, a method of changing a parameter contributing the film formation such as a temperature, a pressure or the like and so on, but the invention is not limited to these methods.

In the invention, it is preferable that a maximum value of Ge concentration in the SiGe layer 6 before the heat treatment is not more than 30%. When the maximum value of Ge concentration exceeds 30%, there is an undesirable tendency that the defects are easily caused between the SOI wafer 4 and the single crystal SiGe layer 6.

In addition, a the thickness of the SiGe layer 6 before the heat treatment becomes too thick, there is a tendency that the defects are easily caused between the SOI wafer 4 and the single crystal SiGe layer 6 likewise the above, so that it is preferable that the thickness of the SiGe layer 6 before the heat treatment is not more than a critical thickness. Moreover, the lower limit of the thickness of the SiGe layer 6 before the heat treatment is preferable to be 5 nm because 30% critical thickness is about 5 nm.

Moreover, the Ge concentration at the surface side of the SiGe layer 6 is 0 mass % in each of FIGS. 2-5. In the invention, the Ge concentration is not necessarily made to 0 mass %. However, it is desirable to make the Ge concentration at the surface as low as possible in order that a partial layer having a high Ge concentration is hardly formed at a subsequent oxidation enrichment.

Also, the gradient of Ge concentration in the SiGe layer before the heat treatment is preferable to be not more than 2%/nm. When the gradient of Ge concentration exceeds 2%/nm, the concentration becomes substantially uniform and the effect by the gradient is undesirably lost.

Although the above is simply described with reference to the embodiments of the invention, various modifications may be added within the scope of the invention. For example, all of the above embodiments of the invention show the use of SIMOX wafer as a wafer for the formation of the strain-relaxed SiGe layer 5, but a laminated SOI wafer may be used.

EXAMPLE 1

In a chamber of a CVD apparatus is placed a SOI wafer 4 and then a single crystal SiGe layer 6 is formed the SOI wafer 4 at a state of heating and keeping the SOI wafer 4 at 700° C. so that a Ge concentration is gradually decreased toward a surface while controlling a flow amount of a gas as a Ge source as shown in FIGS. 2(a) and (b). In this case, a maximum value of Ge concentration in the SiGe layer 6 is 20 mass % and a thickness is 200 nm. Then, a Si layer 10 is formed on the single crystal SiGe layer 6 at a thickness of 13 nm in the CVD apparatus, and thereafter the wafer provided with the Si layer 10 is subjected to a heat treatment in an oxidizing atmosphere of 100% oxygen at 1250° C. for 180 minutes to conduct the oxidation of wafer surface and diffusion of Ge to thereby form a strain-relaxed SiGe layer 5 having a thickness of 100 nm. In this case, the Ge concentration in the strain-relaxed SiGe layer 5 is 20 mass %. Thereafter, a $SiO_2$ layer 9 formed at the surface is peeled and removed with a HF solution and then a strain Si layer 11 is again formed at 12 nm in the CVD apparatus for the evaluation to obtain a semiconductor wafer. Moreover, in order to remove a natural oxide film from the surface after the formation of SiGe layer on SOI layer before epitaxial growth, it is general to conduct a hydrogen heat treatment at a high temperature of not lower than 850° C., a sputtering treatment through Ar ion or a hydrogen plasma treatment at a low temperature. At this moment, the hydrogen heat treatment is carried out at a high temperature of not lower than 850° C.

EXAMPLE 2

In a chamber of a CVD apparatus is placed a SOI wafer 4 and then a portion 8 of a SiGe layer facing the SOI wafer is formed at a uniform Ge concentration (20 mass %) on the SOI wafer 4 at a state of heating and keeping the SOI wafer 4 at 700° C. while controlling a flow amount of a gas as a Ge source and further an upper layer side portion 7 of the SiGe layer 6 is formed so that the Ge concentration is 20 mass % at maximum and is gradually decreased toward a surface (Ge concentration: 0 mass %) as shown in FIGS. 3(a) and (b). In this case, the thickness of the portion 8 of the SiGe layer 6 facing the SOI wafer is 50 nm and the thickness of the upper layer side portion 7 of the SiGe layer 6 is 100 nm. The production steps other than the above are the same as in Example 1.

EXAMPLE 3

In a chamber of a CVD apparatus is placed a SOI wafer 4 and then a portion 8 of a SiGe layer facing the SOI wafer is formed on the SOI wafer 4 at a state of heating and keeping the SOI wafer 4 at 700° C. so that a Ge concentration is gradually increased toward a surface 8a (Ge concentration: 20 mass %) while controlling a flow amount of a gas as a Ge source and further an upper layer side portion 7 of the SiGe layer 6 is formed so that the Ge concentration is gradually decreased toward a surface 7a (Ge concentration: 0 mass %) while controlling the flow amount of the gas as a Ge source as shown in FIGS. 4(a) and (b). In this case, the thicknesses of the portion 8 of the SiGe layer 6 facing the SOI wafer and the upper layer side portion 7 of the SiGe layer 6 are 100 nm, respectively. The production steps other than the above are the same as in Example 1.

EXAMPLE 4

In a chamber of a CVD apparatus is placed a SOI wafer 4 and then a portion 8 of a SiGe layer facing the SOI wafer is formed on the SOI wafer 4 at a state of heating and keeping the SOI wafer 4 at 700° C. so that a Ge concentration is gradually decreased toward a surface 8a (Ge concentration: 0 mass %) while controlling a flow amount of a gas as a Ge source and further an upper layer side portion 7 of the SiGe layer 6 is formed at the same gradient of Ge concentration as in the portion 8 of the SiGe layer 6 facing the SOI wafer as shown in FIGS. 5(a) and (b). In this case, the thicknesses of the portion 8 of the SiGe layer 6 facing the SOI wafer and the upper layer side portion 7 of the SiGe layer 6 are 100 nm, respectively. The production steps other than the above are the same as in Example 1.

COMPARATIVE EXAMPLE

Figure 6:
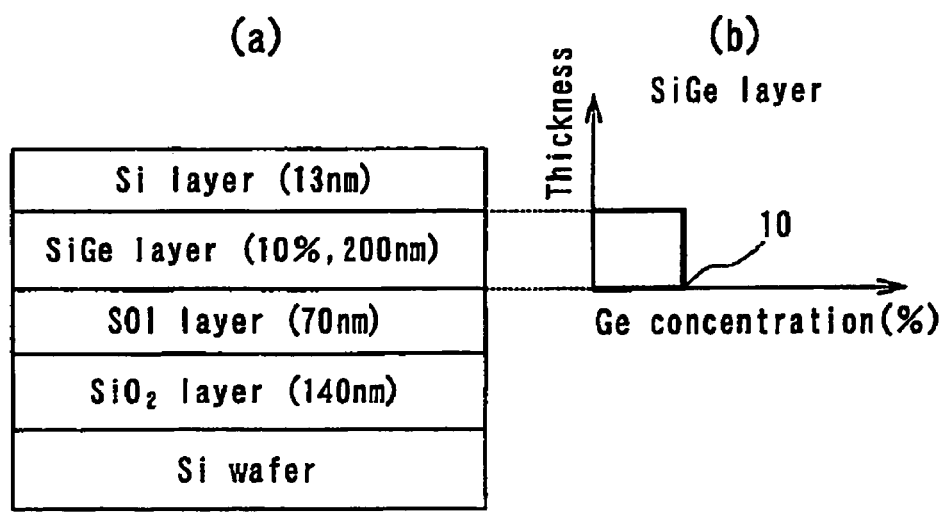
FIG. 6 is a view of an embodiment of SiGe layer before heat treatment (Comparative Example) in which (a) is a section view of the SiGe layer before heat treatment and (b) shows a Ge concentration corresponding to a thickness of the SiGe layer of (a)

As a comparative example, a SOI wafer is placed in a chamber and then a SiGe layer having a uniform Ge concentration (20 mass %) is formed on the SOI wafer at a state of heating and keeping the SOI wafer at 700° C. while controlling a flow amount of a gas as a Ge source as shown in FIGS. 6(a) and (b). In this case, the thickness of the SiGe layer is 200 nm. The production steps other than the above are the same as in Example 1.

Evaluation Method

With respect to each of the thus prepared wafers is measured the defect density at the surface, and the performance is evaluated from the measured value. The defect density is measured by conducting a diluent secco etching and immersing in HF. The evaluation results are shown in FIG. 7.

Figure 7:
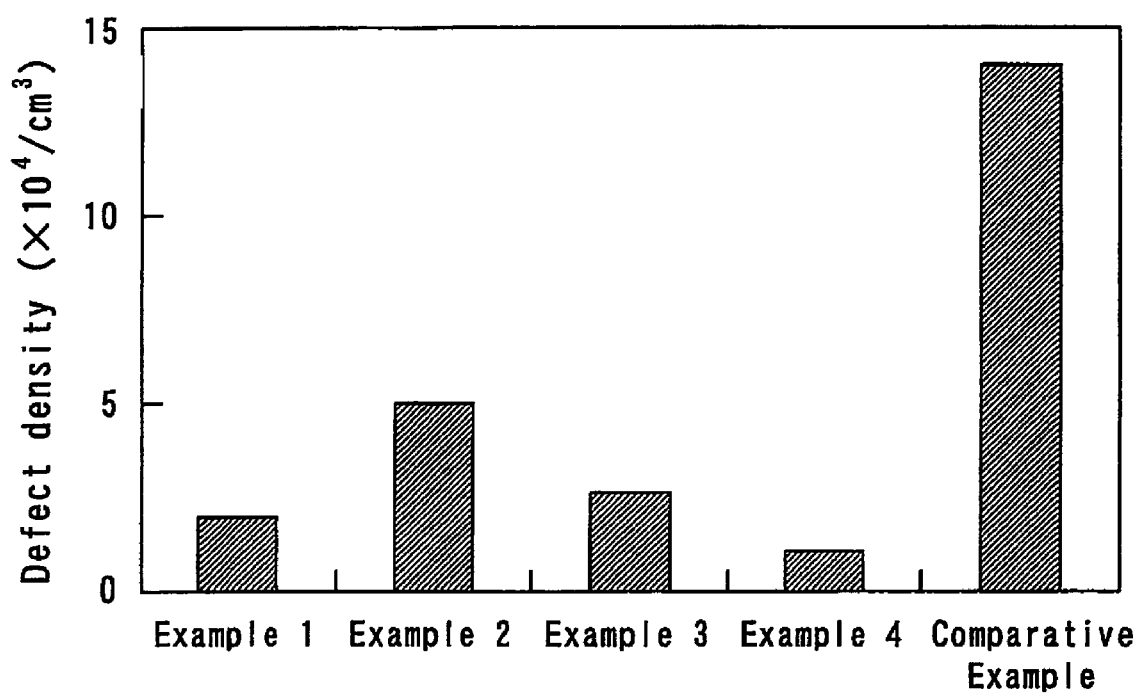
FIG. 7 is a graph showing an evaluation result of a defect density.

As seen from the results of FIG. 7, all of Examples 1-4 are considerably low in the defect density as compared with the comparative example and are less in the defects.

According to the invention, it is possible to provide a method of producing a semiconductor wafer in which a lattice relaxation or a partly lattice-relaxed strain relaxation SiGe layer having a less defect and containing a uniform and high Ge concentration can be formed on an insulating layer in a SOI wafer by rationalizing the Ge concentration in the SiGe layer prior to heat treatment.

What is claimed is:

1. A method of producing a semiconductor wafer by eventually forming a strain-relaxed SiGe layer, including lattice relaxation or a partly lattice-relaxed strain relaxation SiGe layer, on an insulating layer in a SOI wafer comprising a Si wafer, the insulating layer and a SOI layer laminated in this order, comprising the steps of:
   forming a lower portion of the SiGe layer directly on the SOI layer at a gradient of Ge concentration gradually increasing towards the surface thereof away from the SOI layer, thereby forming a graded concentration profile in the lower portion;
   forming an upper portion of the SiGe layer at a gradient of Ge concentration gradually decreasing toward a surface of the SiGe layer away from the SOI layer thereby forming a reverse graded concentration profile in the upper portion;
   forming a Si layer on the SiGe layer; and,
   subjecting the SiGe layer to a heat treatment at a temperature of not lower than 1100 degrees C. in an oxidizing atmosphere,
   wherein at least a part of the upper portion of the SiGe layer and the Si layer changes into a $SiO_2$ layer, and the remaining portion of the SiGe layer and the SOI layer change into the strain-relaxed SiGe layer;
   wherein the reverse graded concentration profile and the graded concentration profile are adjacent to and abut each other to form a single triangular-shaped concentration profile for the SiGE layer, the reverse graded concentration profile forming one side of the single triangular shaped concentration profile, the graded concentration profile forming another side of the single triangular shaped concentration profile;
   wherein the single triangular shaped concentration profile for the SiGe layer is maintained when forming the Si layer on the SiGe layer.

2. The method of producing a semiconductor wafer according to claim 1, wherein the SiGe layer has a maximum value of Ge concentration of not more than 30 mass %.

3. A method of producing a semiconductor wafer comprising:
   forming a SiGe layer over a silicon-on-insulator layer of a silicon-on-insulator wafer, the SiGe layer including two or more sub-layers, neighboring ones of the sub-layers having different Ge concentration profiles, a first sub-layer of the SiGe layer having a Ge concentration gradient decreasing toward a first surface of the SiGe layer away from the silicon-on-insulator layer, thereby forming a reverse graded concentration profile in the first sub-layer; the first sub-layer continuing to the first surface, a second sub-layer of the SiGe layer being formed directly on the silicon-on-insulator layer, the second sub-layer having a Ge concentration gradient different from the first sub-layer;
   forming a Si layer on the SiGe layer; and
   subjecting the silicon-on-insulator wafer to heat treatment at a temperature of not lower than 1100 degrees C. in an oxidizing environment to convert the SiGe layer to a strain-relaxed SiGe layer and silicon oxide,
   wherein the Ge concentration gradient is not more that 2 mass % per nanometer,
   wherein the Ge concentration gradient continues at a substantially non-zero slope to the first surface;
   wherein at least a part of the upper portion of the SiGe layer changes into a $SiO_2$ layer, and the remaining portion of the SiGe layer and the silicon-on-insulator layer change into the strain-relaxed SiGe layer; and
   wherein the second sublayer of the SiGe layer facing the wafer is formed at a gradient of Ge concentration gradually increasing toward the surface thereof thereby forming a graded concentration profile in the lower portion, and then the upper portion of the SiGe layer is formed;
   wherein the first sublayer and second sublayer are adjacent to and abut each other such that the reverse graded concentration profile and the graded concentration profile form a single triangular-shaped concentration profile, the reverse graded concentration profile forming one side of the single triangular shaped concentration profile, the graded concentration profile forming another side of the single triangular shaped concentration profile;
   wherein the single triangular shaped concentration profile for the SiGE layer is maintained when forming the Si layer on the SiGe layer.

* * * * *